United States Patent
Sim et al.

(10) Patent No.: US 11,781,517 B2
(45) Date of Patent: Oct. 10, 2023

(54) ELECTRODE WEAR AMOUNT PREDICTING SYSTEM AND METHOD OF SPARK PLUG

(71) Applicants: Hyundai Motor Company, Seoul (KR); Kia Corporation, Seoul (KR)

(72) Inventors: Kiseon Sim, Whasung-Si (KR); Soo Hyung Woo, Whasung-Si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 0 days.

(21) Appl. No.: 17/843,429

(22) Filed: Jun. 17, 2022

(65) Prior Publication Data
US 2023/0029000 A1 Jan. 26, 2023

(30) Foreign Application Priority Data

Jul. 26, 2021 (KR) .......................... 10-2021-0097984

(51) Int. Cl.
*F02P 17/12* (2006.01)
*G01R 19/165* (2006.01)

(52) U.S. Cl.
CPC ........ *F02P 17/12* (2013.01); *G01R 19/16533* (2013.01)

(58) Field of Classification Search
CPC .......... F02P 17/12; F02P 3/0414; F02P 15/10; F02P 13/00; G01R 19/16533; F02D 2041/228; H01T 13/58
See application file for complete search history.

(56) References Cited

U.S. PATENT DOCUMENTS

| | | | |
|---|---|---|---|
| 9,080,509 B2 * | 7/2015 | Huberts | ................ F02P 3/0554 |
| 9,429,134 B2 | 8/2016 | Desai et al. | |
| 10,006,432 B2 | 6/2018 | Desai et al. | |
| 10,651,630 B2 * | 5/2020 | Karumi | ................ H01T 21/02 |
| 11,199,170 B2 * | 12/2021 | Funato | ................ F02P 17/12 |
| 2013/0206106 A1 * | 8/2013 | Huberts | ................ F02P 17/12 |
| | | | 123/406.27 |
| 2019/0372313 A1 * | 12/2019 | Karumi | ................ H01T 13/58 |
| 2023/0035555 A1 * | 2/2023 | Sim | ......... H01F 38/12 |

FOREIGN PATENT DOCUMENTS

JP 6782279 B2 11/2020

* cited by examiner

*Primary Examiner* — Freddie Kirkland, III
(74) *Attorney, Agent, or Firm* — MORGAN, LEWIS & BOCKIUS LLP

(57) ABSTRACT

An electrode wear amount predicting system of a spark plug, includes: at least one ignition coil that includes a primary coil and a secondary coil; a spark plug that generates a spark discharge by a discharge current generated by the ignition coil and includes a center electrode and a ground electrode; a sensing portion measuring a current applied to the primary coil; and a controller that determines a wear state of the center electrode and the ground electrode according to an amount of the current applied to the primary coil detected by the sensing portion when an electrode wear amount predicting condition is satisfied.

14 Claims, 7 Drawing Sheets

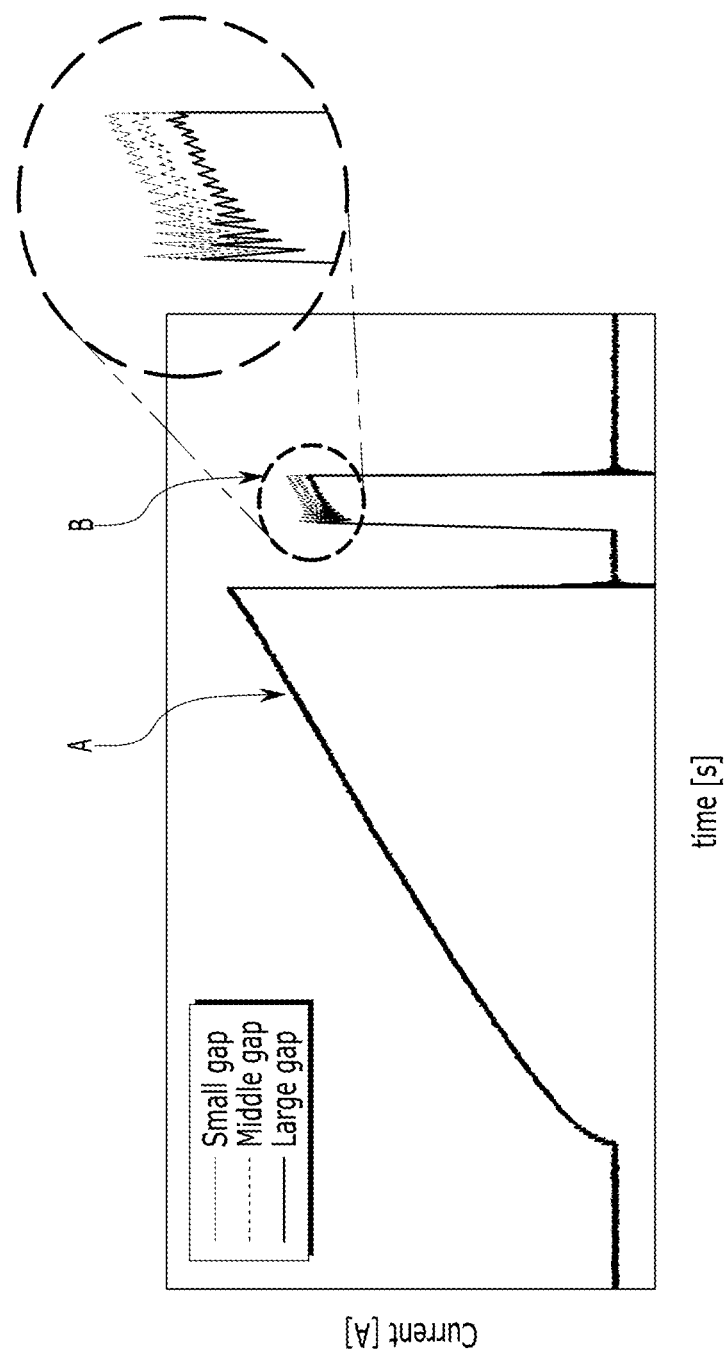

ELECTRODE WEAR AMOUNT PREDICTING SYSTEM AND METHOD OF SPARK PLUG

CROSS-REFERENCE TO RELATED APPLICATION

The present application claims priority to Korean Patent Application No. 10-2021-0097984 filed on Jul. 26, 2021, the entire contents of which is incorporated herein for all purposes by this reference.

BACKGROUND OF THE PRESENT DISCLOSURE

Field of the Present Disclosure

The present disclosure relates to an electrode wear amount predicting system and method of a spark plug, and more particularly, to an electrode wear amount predicting system and method of a spark plug in which an electrode wear amount may be predicted from a current applied to a primary coil of an ignition coil that supplies a current to an electrode of the spark plug.

Description of Related Art

In gasoline vehicles, a mixture of air and fuel is ignited by a spark generated by a spark plug to be combusted. That is, the air-fuel mixture injected into a combustion chamber during a compression stroke is ignited by a discharge phenomenon of the spark plug, and thus energy required for vehicle's driving is generated while undergoing a high temperature and high pressure expansion process.

The spark plug provided in the gasoline vehicle serves to ignite a compressed air-fuel mixture by spark discharge caused by a high voltage current generated by an ignition coil.

In a conventional spark plug, a high voltage current (or a discharge current) is generated in a secondary coil of an ignition coil due to electromagnetic induction of a current applied to a primary coil of the ignition coil, and thus spark discharge occurs between a center electrode and a ground electrode.

Recently, due to the use of an exhaust gas recirculation device or the development of a lean-burn engine, a lot of ignition energy must be supplied into the combustion chamber. To the present end, a method of performing multi-stage ignition in which the spark plug is ignited a plurality of times during the explosion stroke is used.

However, when the multi-stage ignition is used by use of the spark plug, the electrode of the spark plug may be rapidly worn. When the electrode of the spark plug is worn, combustion stability is lowered, so that emission deteriorates, and riding comfort deteriorates.

The information included in this Background of the present disclosure is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing an electrode wear amount predicting system and method of a spark plug.

Various aspects of the present disclosure are directed to providing an electrode wear amount predicting system of a spark plug, including: at least one ignition coil that includes a primary coil and a secondary coil; a spark plug that generates a spark discharge by a discharge current generated by the ignition coil and includes a center electrode and a ground electrode; a sensing portion measuring a current applied to the primary coil; and a controller that determines a wear state of the center electrode and the ground electrode according to an amount of the current applied to the primary coil detected by the sensing portion when an electrode wear amount predicting condition is satisfied.

The electrode wear amount predicting condition may be satisfied when an engine is stopped or the engine is in an idle state.

The controller may be configured to determine that the center electrode and the ground electrode are worn when the current applied to the primary coil is smaller than a set threshold value.

The electrode wear amount predicting system may further include a display portion that provides the wear state of the center electrode and the ground electrode to a driver.

The sensing portion may directly measure the current applied to the primary coil.

Alternatively, the sensing portion may determine a current of the primary coil based on a resistance value of a resistor electrically connected in series to the primary coil and a voltage applied to the resistor.

Various aspects of the present disclosure are directed to providing an electrode wear amount predicting method of a spark plug, wherein the spark plug generates spark discharge by a discharge current generated by at least one ignition coil including a primary coil and a secondary coil and includes a center electrode and a ground electrode, including: determining whether an electrode wear amount predicting condition is satisfied; measuring a current applied to the primary coil; and determining a wear state of the center electrode and the ground electrode based on an amount of the current applied to the primary coil.

When the current applied to the primary coil is smaller than a set threshold value, it may be determined that the center electrode and the ground electrode are worn.

The electrode wear amount predicting method may further include providing a wear state of the center electrode and the ground electrode to a driver.

According to the electrode wear amount predicting system and method of the spark plug according to the exemplary embodiment of the present disclosure as described above, by predicting a current applied to a secondary coil of an ignition coil from a current applied to a primary coil of the ignition coil, it is possible to predict a wear state of a center electrode and a ground electrode through relatively inexpensive equipment.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

BRIEF DESCRIPTION OF THE DRAWINGS

FIG. 6 illustrates a graph measuring a primary current of an ignition coil according to various exemplary embodiments of the present disclosure.

Figure 1:
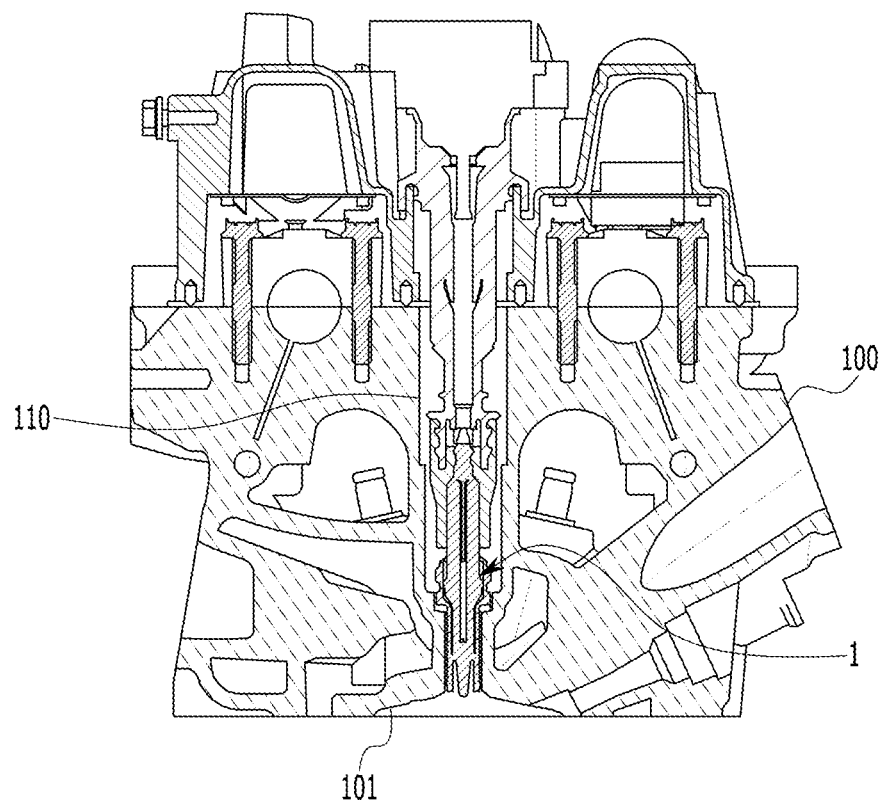
FIG. 1 illustrates a cross-sectional view of an engine in which a spark plug is mounted according to various exemplary embodiments of the present disclosure.

It may be understood that the appended drawings are not necessarily to scale, presenting a somewhat simplified representation of various features illustrative of the basic principles of the present disclosure. The specific design features of the present disclosure as included herein, including, for example, specific dimensions, orientations, locations, and shapes will be determined in part by the particularly intended application and use environment.

In the figures, reference numbers refer to the same or equivalent parts of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Exemplary embodiments of the present disclosure will be described more fully hereinafter with reference to the accompanying drawings, in which embodiments of the present disclosure are shown. As those skilled in the art would realize, the described embodiments may be modified in various different ways, all without departing from the spirit or scope of the present disclosure.

To clearly describe the present disclosure, parts that are irrelevant to the description are omitted, and identical or similar constituent elements throughout the specification are denoted by the same reference numerals.

Furthermore, because the size and thickness of each configuration shown in the drawings are arbitrarily shown for convenience of description, the present disclosure is not necessarily limited to configurations illustrated in the drawings, and to clearly illustrate several parts and areas, enlarged thicknesses are shown.

Hereinafter, an electrode wear amount predicting system of a spark plug according to various exemplary embodiments of the present disclosure will be described in detail with reference to the accompanying drawings.

First, configurations of a spark plug and an engine to which an electrode wear amount predicting system of a spark plug of the present disclosure is applied will be described.

FIG. 1 illustrates a cross-sectional view of an engine in which a spark plug is mounted according to various exemplary embodiments of the present disclosure.

As shown in FIG. 1, a spark plug 1 according to various exemplary embodiments of the present disclosure is mounted on a combustion chamber 101 of an engine, and generates spark discharge.

The engine to which the spark plug 1 is applied includes a cylinder block and a cylinder head, and the cylinder block and the cylinder head are combined to form a combustion chamber 101 therein. An air and fuel mixture flowing into the combustion chamber 101 is ignited by spark discharge generated by the spark plug 1.

In the cylinder head, a mount hole 110 in which the spark plug 1 is mounted is formed long in a vertical direction. A lower portion of the spark plug 1 which is mounted in the mount hole 110 protrudes into the combustion chamber 101. A center electrode 2 and a ground electrode 3 that are electrically connected to an ignition coil are formed at the lower portion of the spark plug 1, and the spark discharge is generated between the center electrode 2 and the ground electrode 3.

Figure 2:
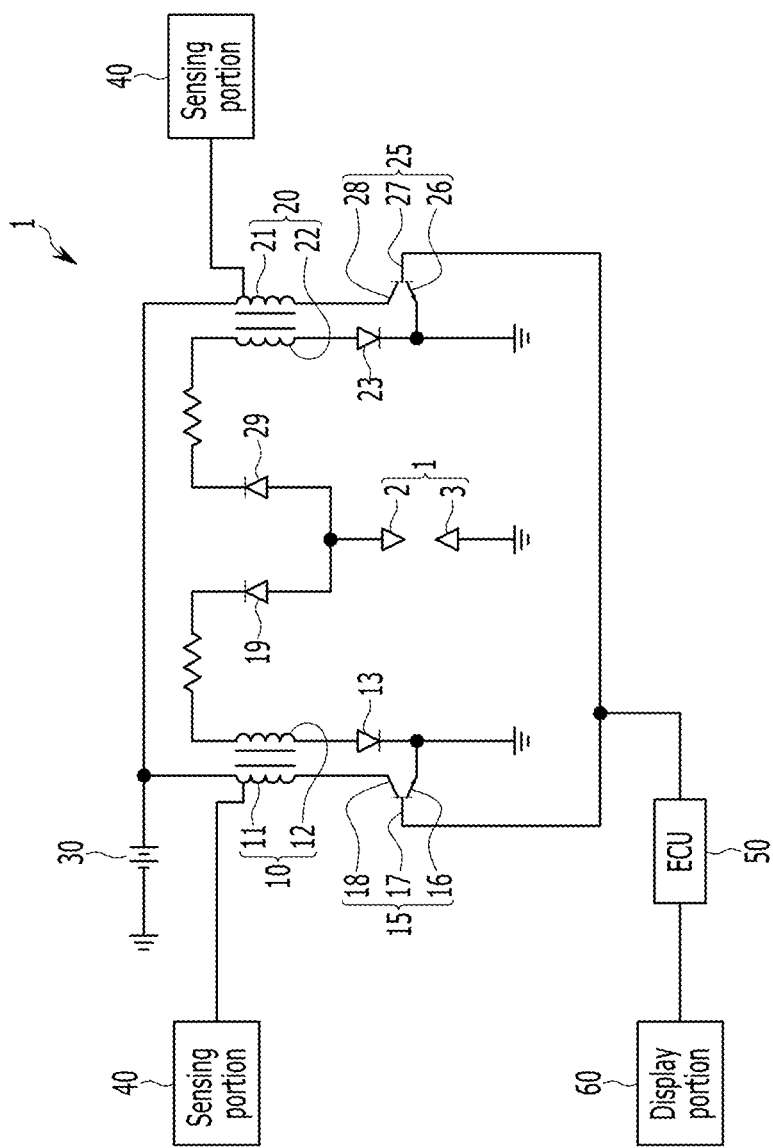
FIG. 2 illustrates a configuration of an ignition coil control system applied to a system for predicting an electrode wear amount of a spark plug according to various exemplary embodiments of the present disclosure.
Figure 3:
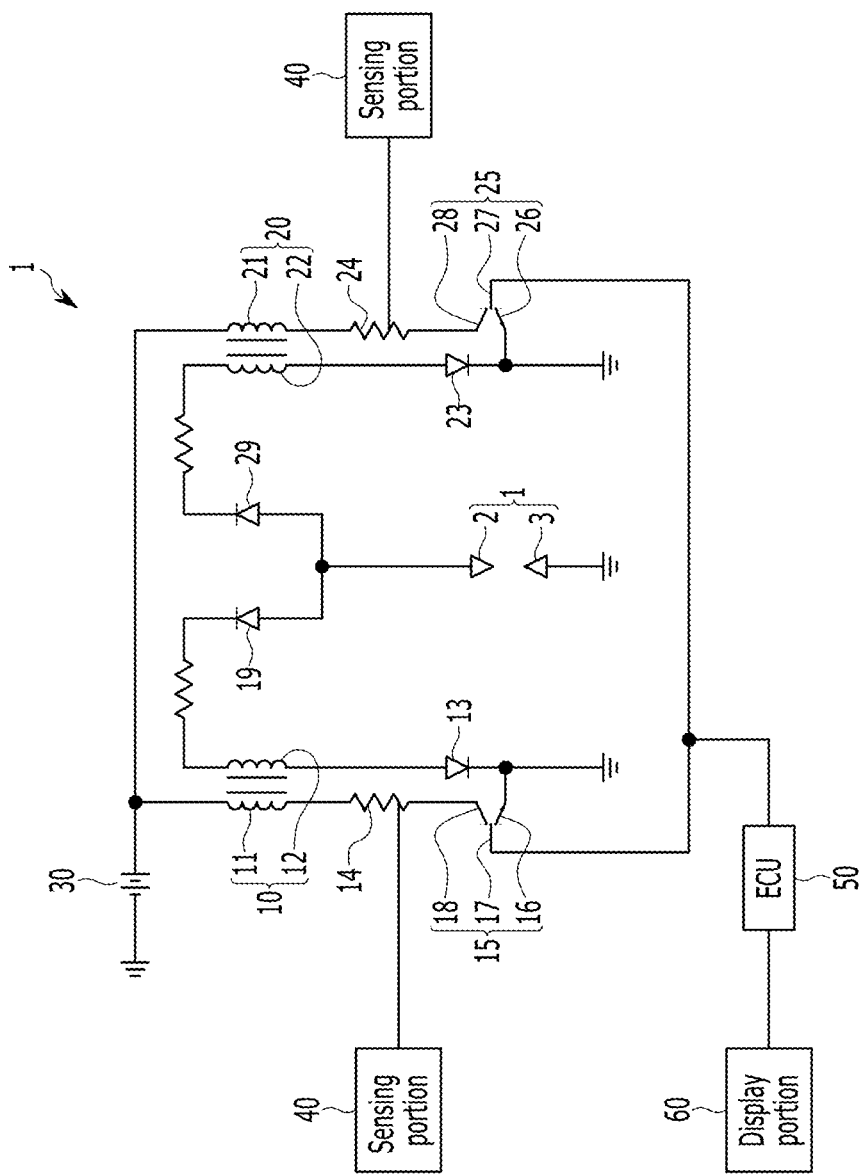
FIG. 3 illustrates a configuration of an ignition coil control system applied to an electrode wear amount predicting system of a spark plug according to various exemplary embodiments of the present disclosure.

FIG. 2 illustrates a configuration of an ignition coil control system applied to an electrode wear amount predicting system of a spark plug according to various exemplary embodiments of the present disclosure. FIG. 3 illustrates a configuration of an ignition coil control system applied to an electrode wear amount predicting system of a spark plug according to various exemplary embodiments of the present disclosure.

As shown in FIG. 2 and FIG. 3, an electrode wear amount predicting system of a spark plug according to various exemplary embodiments of the present disclosure (hereinafter, for convenience of description, as necessary, also referred to as a 'prediction system') may include at least one ignition coil 10 or 20 including a primary coil 11 or 21 and a secondary coil 12 or 22, a sensing portion 40 for measuring a current applied to the primary coil 11 or 21, and a controller 50 that controls an operation of the ignition coil 10 or 20 and predicts a wear amount of an electrode.

The controller 50 may predict the electrode wear amount from the current of the primary coil 11 or 21 measured by the sensing portion 40.

To the present end, the controller 50 may be provided as at least one processor executed by a predetermined program, and the predetermined program is configured to perform respective steps of an ignition coil control method according to various exemplary embodiments of the present disclosure.

In the exemplary embodiment of the present disclosure, the prediction system may include two ignition coils 10 and 20 for applying a current to the center electrode 2 and the ground electrode 3.

The first ignition coil 10 includes a primary coil 11 and a secondary coil 12, one end portion of the primary coil 11 is electrically connected to a battery 30 of a vehicle, and the other end portion of the primary coil 11 is grounded through a first switch 15. According to an ON/OFF operation of the first switch 15, the primary coil 11 of the first ignition coil 10 may be selectively electrically connected.

The first switch 15 may be implemented as an Negative-Positive-Negative (NPN) transistor switch including an emitter terminal 16, a collector terminal 18, and a base terminal 17. That is, the other end portion of the primary coil 11 may be electrically connected to the collector terminal 18 of the first switch 15, the emitter terminal 16 thereof may be grounded, and the base terminal 17 thereof may be electrically connected to the controller 50.

One end portion of the secondary coil 12 is electrically connected to the center electrode 2, and the other end portion thereof is electrically connected to the emitter terminal 16 of the first switch 15. A diode 13 is provided between the secondary coil 12 and the emitter terminal 16 to block a current from flowing from the secondary coil 12 to the emitter terminal 16.

Furthermore, a diode 19 is provided between the secondary coil 12 and the center electrode 2, so that a current flows only from the secondary coil 12 to the center electrode 2.

When a duty signal is applied to the base terminal 17 of the first switch 15 by the controller 50, the primary coil 11 of the first ignition coil 10 is electrically connected, and electrical energy is charged to the primary coil 11. When no duty signal is applied to the base terminal 17 of the first switch 15 by the controller 50, a high voltage current (or discharge current) is generated in the secondary coil 12 due to electromagnetic induction of the primary coil 11 and the secondary coil 12. The discharge current generated in the secondary coil 12 flows to the center electrode 2, and while spark discharge being generated between the center electrode 2 and the ground electrode 3 by the discharge current generated in the secondary coil 12, an air-fuel mixture inside the combustion chamber 101 is ignited.

That is, the controller 50 charges or discharges the first ignition coil 10 by turning the first switch 15 ON/OFF. When the controller 50 applies a control signal (or duty signal) to the base terminal 17 of the first switch 15 (or when the switch is turned on), the primary coil 11 is charged (or the first ignition coil is charged).

Furthermore, when the controller 50 does not apply a control signal to the base terminal 17 of the first switch 15 (or when the first switch is turned off), a high voltage current is generated in the secondary coil 12 due to electromagnetic induction with the primary coil 11, and spark discharge is generated between the center electrode 2 and the ground electrode 3 (or the first ignition coil is discharged) by the predetermined voltage current generated in the secondary coil 12.

Like the first ignition coil 10, the second ignition coil 20 includes a primary coil 21 and a secondary coil 22, one end portion of the primary coil 21 is electrically connected to the battery 30 of the vehicle, and the other end portion of the primary coil 21 is grounded through a second switch 25. According to an ON/OFF operation of the second switch 25, the primary coil 21 of the second ignition coil 20 may be selectively electrically connected.

The second switch 25 may be implemented as an Negative-Positive-Negative (NPN) transistor switch including an emitter terminal 26, a collector terminal 28, and a base terminal 27. That is, the other end portion of the primary coil 21 may be electrically connected to the collector terminal 28 of the second switch 25, the emitter terminal 26 thereof may be grounded, and the base terminal 27 thereof may be electrically connected to the controller 50.

One end portion of the secondary coil 22 is electrically connected to the center electrode 2, and the other end portion thereof is electrically connected to the emitter terminal 26 of the second switch 25. A diode 23 is provided between the secondary coil 22 and the emitter terminal 26 to block a current from flowing from the secondary coil 22 to the emitter terminal 26.

Furthermore, a diode 23 is provided between the secondary coil 22 and the center electrode 2, so that a current flows only from the secondary coil 22 to the center electrode 2.

When a control signal is applied to the base terminal 27 of the second switch 25 by the controller 50, the primary coil 21 of the second ignition coil 20 is electrically connected, and electrical energy is charged to the primary coil 21. When no control signal is applied to the base terminal 27 of the second switch 25 by the controller 50, a high voltage current (or discharge current) is generated in the secondary coil 22 due to electromagnetic induction of the primary coil 21 and the secondary coil 22. The discharge current generated in the secondary coil 22 flows to the center electrode 2, and while spark discharge being generated between the center electrode 2 and the ground electrode 3 by the discharge current generated in the secondary coil 22, an air-fuel mixture inside the combustion chamber 101 is ignited.

That is, the controller 50 charges or discharges the second ignition coil 20 by turning the second switch 25 ON/OFF. When the controller 50 applies a control signal to the base terminal 27 of the second switch 25 (or when the switch is turned on), the primary coil 21 is charged (or the second ignition coil is charged).

Furthermore, when the controller 50 does not apply a control signal to the base terminal 27 of the second switch 25 (or when the second switch is turned off), a high voltage current is generated in the secondary coil 22 due to electromagnetic induction with the primary coil 21, and spark discharge is generated between the center electrode 2 and the ground electrode 3 (or the second ignition coil is discharged) by the high voltage current generated in the secondary coil 22.

In the specification of the present disclosure, charging the primary coil of the first ignition coil 10 by turning on the first switch 15 is referred to as charging the first ignition coil 10, and a high voltage current which is induced to the secondary coil of the first ignition coil 10 by turning off the first switch 15 and thus spark discharge occurs between the center electrode 2 and the ground electrode 3 is referred to as the first ignition coil 10 being discharged.

Likewise, charging the primary coil of the second ignition coil 20 by turning on the second switch 25 is referred to as charging the second ignition coil 20, and a high voltage current which is induced to the secondary coil of the second ignition coil 20 by turning off the second switch 25 and thus spark discharge occurs between the center electrode 2 and the ground electrode 3 is referred to as the second ignition coil 20 being discharged.

The sensing portion 40 detects a current applied to the primary coil 11 of the first ignition coil 10 and the primary coil 21 of the second ignition coil 20, and transmits an amount of the detected current to the controller 50.

The sensing portion 40 may be a current sensor which is configured to measure a current applied to the primary coil 11 of the first ignition coil 10 and the primary coil 21 of the second ignition coil 20.

Alternatively, the sensing portion 40 may be a voltage sensor which is configured to measure a voltage applied to resistors 14 and 24 provided between the primary coils 11 and 21 and the first switches 15 and 25 (see FIG. 3). In the instant case, the controller 50 may determine the current applied to the primary coils 11 and 21 by use of the voltage and the resistance value transmitted from the sensing portion 40.

The prediction system according to the exemplary embodiment of the present disclosure may further include a display portion 60 that provides a wear state of the center electrode and the ground electrode predicted by the controller 50 to a driver. The display portion 60 may be implemented through a cluster or an audio video navigation (AVN) system mounted on a vehicle.

Hereinafter, an operation of the prediction system of the vehicle according to the exemplary embodiment of the present disclosure as described above will be specifically described with reference to the accompanying drawings.

Figure 4:
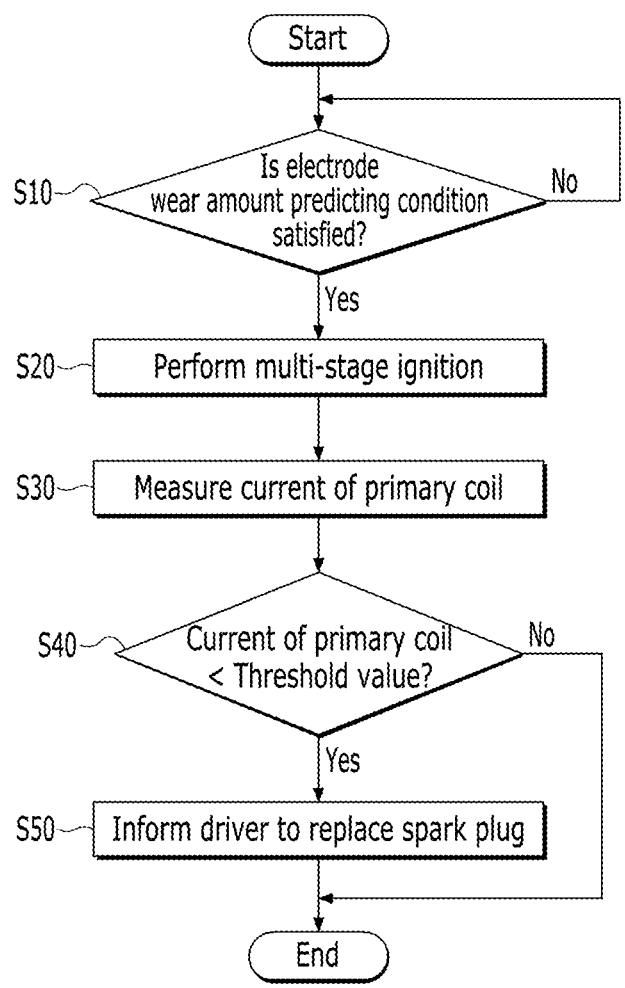
FIG. 4 illustrates a flowchart of a method for predicting an electrode wear amount of a spark plug according to various exemplary embodiments of the present disclosure.

FIG. 4 illustrates a flowchart of a method for predicting an electrode wear amount of a spark plug according to various exemplary embodiments of the present disclosure.

As shown in FIG. 4, the controller 50 determines whether an electrode wear amount predicting condition of the spark plug 1 is satisfied (S10).

Here, the electrode wear amount predicting condition may be satisfied when the engine is stopped or the engine is in an idle state.

In the exemplary embodiment of the present disclosure, it is determined whether the electrode of the spark plug 1 is worn only when the electrode wear amount predicting condition is satisfied. When the engine is stopped or the engine is in the idle state, the flow in the combustion chamber 101 is maintained constant.

When the engine normally operates, the flow inside the combustion chamber 101 is not maintained constant due to a change in engine torque. In the instant case, since the flow of the mixed air between the center electrode 2 and the ground electrode 3 of the spark plug 1 is rapidly changed, the discharge energy between the center electrode 2 and the ground electrode 3 of the spark plug 1 is rapidly changed.

For example, when the flow inside the combustion chamber 101 is fast or the pressure therein is high, since the discharge energy generated between the center electrode 2 and the ground electrode 3 is rapidly consumed, discharge is made in a state in which sufficient energy (or current) is not charged in the secondary coils 12 and 22 of the ignition coils 10 and 20, and discharge is made in a state in which sufficient energy (or current) is not charged even in the primary coils 11 and 21 of the ignition coils 10 and 20.

Conversely, when the flow inside the combustion chamber 101 is slow or the pressure therein is low, since the discharge energy generated between the center electrode 2 and the ground electrode 3 is slowly consumed, excessive energy (or current) is charged in the secondary coils 12 and 22 of the ignition coils 10 and 20, and excessive energy (or current) is also charged in the primary coils 11 and 21 of the ignition coils 10 and 20.

Accordingly, the electrode wear amount of the spark plug 1 is predicted only when the engine is in a stopped state or the engine is in an idle state in which the electrode wear amount predicting condition in which the flow and pressure inside the combustion chamber 101 are maintained constant is satisfied.

When the electrode wear predicting condition is satisfied, the controller 50 applies a duty signal to the primary coils 11 and 21 of the ignition coils 10 and 20 to perform multi-stage ignition (S20). In the exemplary embodiment of the present disclosure, the multi-stage ignition means performing ignition multiple times during an explosion stroke.

Figure 5:
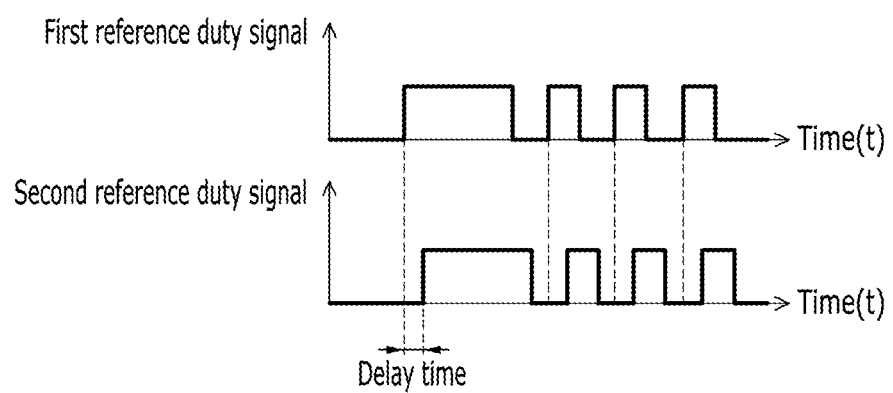
FIG. 5 illustrates a duty signal according to various exemplary embodiments of the present disclosure.

Referring to FIG. 5, the duty signal may be a reference duty signal. The reference duty signal generated by the controller 50 may include a plurality of pulse signals. Periods of the pulses of the reference duty signal may be the same or different from each other.

For example, the reference duty signal may include four pulse signals. In the instant case, a period of the most preceding pulse (or a duration of the pulse signal) may be determined as a time when the first ignition coil 10 and the second ignition coil 20 are fully charged. Furthermore, periods of the remaining three pulses following the most preceding pulse may be the same. Here, the period of the most preceding pulse may be the longest, and the periods of the following three pulses may be shorter than the period of the most preceding pulse. However, the scope of the present disclosure is not limited thereto, and the number and the periods of the pulses of the reference duty signal may be changed as necessary.

When the reference duty signal from the controller 50 is applied to the first switch 15 of the first ignition coil 10, the first switch 15 is turned ON/OFF in synchronization with the reference duty signal, and the first ignition coil 10 is charged and discharged according to the ON/OFF of the first switch 15.

The first ignition coil 10 is charged while the first switch 15 is turned on in synchronization with the on time of the reference duty signal. Furthermore, the first ignition coil 10 is discharged while the first switch 15 is turned off in synchronization with the off time of the reference duty signal.

In the same method, when the reference duty signal from the controller 50 is applied to the second switch 25 of the second ignition coil 20, the second switch 25 is turned ON/OFF in synchronization with the reference duty signal, and the second ignition coil 20 is charged and discharged according to the ON/OFF of the second switch 25.

The second ignition coil 20 is charged while the second switch 25 is turned on in synchronization with the on time of the reference duty signal. Furthermore, the second ignition coil 20 is discharged while the second switch 25 is turned off in synchronization with the off time of the reference duty signal.

In the exemplary embodiment of the present disclosure, the duty signal generated by the controller 50 may be applied to the first switch 15 of the first ignition coil 10 and the second switch 25 of the second ignition coil 20, respectively. Furthermore, the duty signal applied to the first switch 15 and the duty signal applied to the second switch 25 may be delayed for a set delay time, and the multi-stage ignition may be realized by the delay of the duty signals applied to the first switch 15 and the second switch 25.

First, referring to FIG. 6, a principle capable of predicting the electrode wear amount of the spark plug according to the exemplary embodiment of the present disclosure will be described.

As a gap between the center electrode 2 and the ground electrode 3 of the spark plug 1 increases, resistance between the center electrode 2 and the ground electrode 3 increases. Due to the provided configuration, a discharge voltage increases, and energy stored in the ignition coil is rapidly consumed.

Conversely, as the gap between the center electrode 2 and the ground electrode 3 of the spark plug 1 decreases, the resistance between the center electrode 2 and the ground electrode 3 decreases. Due to the provided configuration, the discharge voltage decreases, and the energy stored in the ignition coil is slowly consumed.

When the ignition coil is charged before all the energy stored (or charged) in the ignition coil is exhausted (or discharged), charging of the ignition coil starts from the energy level stored in the ignition coil. Accordingly, the gap between the two electrodes 2 and 3 affects the charging current of the ignition coil.

For example, when the gap between the two electrodes 2 and 3 is large, because the energy stored in the ignition coil is rapidly discharged, the charging current of the ignition coil is relatively small when the ignition coil is recharged after the ignition coil is discharged. Conversely, when the gap between the two electrodes 2 and 3 is small, because the energy stored in the ignition coil is slowly discharged, the charging current of the ignition coil is relatively large when the ignition coil is recharged after the ignition coil is discharged.

Accordingly, by measuring the charging current of the ignition coil, the gap between the two electrodes 2 and 3 may be predicted.

Referring back to FIG. 4, the sensing portion 40 detects the current applied to the primary coils 11 and 21 of the ignition coils 10 and 20, and transmits the detected current value of the primary coils 11 and 21 to the controller 50 (S30).

When the current applied to the primary coils 11 and 21 of the ignition coils 10 and 20 transmitted from the sensing portion 40 is smaller than a set threshold value (S40), the controller 50 determines the center electrode 2 and the ground electrode 3 of the spark plug 1 to be excessively worn. Furthermore, the controller 50 informs the driver to replace the spark plug 1 through the display portion 60 (S50).

The current applied to the primary coil during the multi-stage ignition is configured for a plurality of current pulses. In the instant case, when current pulses (refer to B1, B2, and B3 display portions in FIGS. 7A, 7B and 7C) following the most preceding current pulse (refer to an A display portion in FIGS. 7A, 7B and 7C 7) among the currents applied to the primary coil are smaller than a set threshold value, it may be determined that the center electrode 2 and the ground electrode 3 of the spark plug 1 are excessively worn.

When the center electrode 2 and the ground electrode 3 are worn, because the gap between the center electrode 2 and the ground electrode 3 increases, the resistance between the center electrode 2 and the ground electrode 3 increases. As the resistance between the center electrode 2 and the ground electrode 3 increases, the discharge voltage between the center electrode 2 and the ground electrode 3 increases, and the discharge current between the center electrode 2 and the ground electrode 3 decreases.

When the discharge current between the center electrode 2 and the ground electrode 3 decreases, because the discharge is made in a state in which a sufficient current is not charged in the secondary coils 12 and 22 of the ignition coils 10 and 20, the discharge is made in a state in which a sufficient current is also charged in the primary coils 11 and 21 of the ignition coils 10 and 20.

Accordingly, by measuring the current applied to the primary coils 11 and 21 of the ignition coils 10 and 20, the wear state of the center electrode 2 and ground electrode 3 may be determined.

As shown in FIG. 6, it may be seen that as the gap between the center electrode 2 and the ground electrode 3 increases, the magnitude of the current pulse B following the most preceding current pulse A of the primary coil decreases.

Figure 7A:
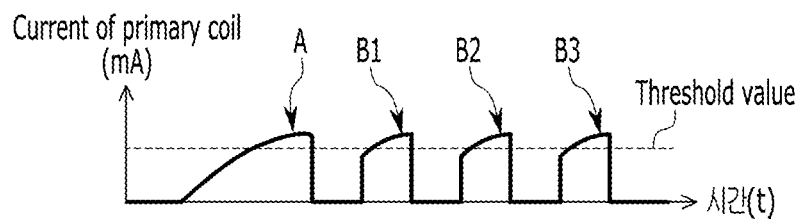
FIG. 7A, FIG. 7B and FIG. 7C illustrate graphs of a primary current of an ignition coil according to various exemplary embodiments of the present disclosure.
Figure 7B:
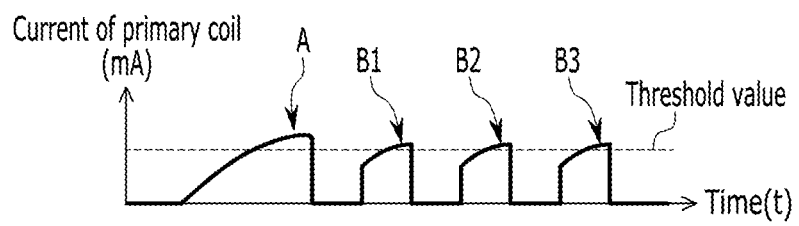

Referring to FIGS. 7A and 7B, it may be seen that the primary-side current of the ignition coils 10 and 20 in a normal state is greater than or equal to the threshold value (see FIG. 7A and FIG. 7B).

Figure 7C:
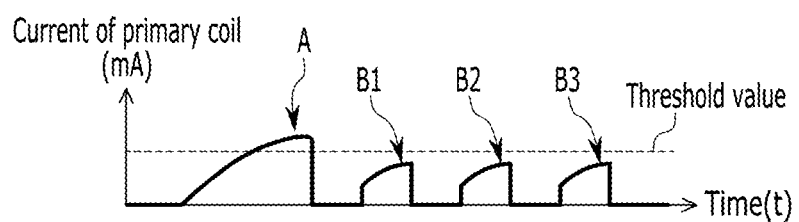

However, it may be seen that when the center electrode 2 and the ground electrode 3 are worn so that the gap between the center electrode 2 and the ground electrode 3 increases, the primary-side current of the ignition coils 10 and 20 is smaller than the threshold value (see FIG. 7C).

To determine the wear state of the center electrode 2 and the ground electrode 3, a more accurate result may be obtained by measuring the current applied to the secondary coils 12 and 22 of the ignition coils 10 and 20. However, the current applied to the secondary coils 12 and 22 of the ignition coils 10 and 20 is relatively very low (approximately a peak value of 200 mA), and the voltage applied to the secondary coils 12 and 22 of the ignition coils 10 and 20 is relatively very high (about 2 to 3 KV). Therefore, to measure the current or voltage applied to the secondary coils 12 and 22 of the ignition coils 10 and 20, very expensive equipment is required.

Accordingly, the present disclosure predicts the current applied to the secondary coils 12 and 22 of the ignition coils 10 and 20 from the current applied to the primary coils 11 and 21 of the ignition coils 10 and 20, so that the wear state of the center electrode 2 and the ground electrode 3 may be predicted through relatively inexpensive equipment.

Furthermore, the term related to a control device such as "controller", "control apparatus", "control unit", "control device", "control module", or "server", etc refers to a hardware device including a memory and a processor configured to execute one or more steps interpreted as an algorithm structure. The memory stores algorithm steps, and the processor executes the algorithm steps to perform one or more processes of a method in accordance with various exemplary embodiments of the present disclosure. The control device according to exemplary embodiments of the present disclosure may be implemented through a nonvolatile memory configured to store algorithms for controlling operation of various components of a vehicle or data about software commands for executing the algorithms, and a processor configured to perform operation to be described above using the data stored in the memory. The memory and the processor may be individual chips. Alternatively, the memory and the processor may be integrated in a single chip. The processor may be implemented as one or more processors. The processor may include various logic circuits and operation circuits, may process data according to a program provided from the memory, and may generate a control signal according to the processing result.

The control device may be at least one microprocessor operated by a predetermined program which may include a series of commands for carrying out the method included in the aforementioned various exemplary embodiments of the present disclosure.

The aforementioned invention can also be embodied as computer readable codes on a computer readable recording medium. The computer readable recording medium is any data storage device that can store data which may be thereafter read by a computer system and store and execute program instructions which may be thereafter read by a computer system. Examples of the computer readable recording medium include Hard Disk Drive (HDD), solid state disk (SSD), silicon disk drive (SDD), read-only memory (ROM), random-access memory (RAM), CD-ROMs, magnetic tapes, floppy discs, optical data storage devices, etc and implementation as carrier waves (e.g., transmission over the Internet). Examples of the program instruction include machine language code such as those generated by a compiler, as well as high-level language code which may be executed by a computer using an interpreter or the like.

In various exemplary embodiments of the present disclosure, the control device may be implemented in a form of hardware or software, or may be implemented in a combination of hardware and software.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of predetermined exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described in order to explain certain principles of the invention and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. An electrode wear amount predicting system of a spark plug, the electrode wear amount predicting system comprising:
    at least one ignition coil that includes a primary coil and a secondary coil;
    the spark plug that generates a spark discharge by a discharge current generated by the ignition coil and includes a center electrode and a ground electrode;
    a sensing portion measuring a current applied to the primary coil; and
    a controller configured for determining a wear state of the center electrode and the ground electrode according to an amount of the current applied to the primary coil detected by the sensing portion when an electrode wear amount predicting condition is satisfied.

2. The electrode wear amount predicting system of claim 1, wherein the electrode wear amount predicting condition is satisfied when an engine is stopped or the engine is in an idle state.

3. The electrode wear amount predicting system of claim 1, wherein the controller is configured to conclude that the center electrode and the ground electrode are worn when the current applied to the primary coil is smaller than a set threshold value.

4. The electrode wear amount predicting system of claim 3, further including
    a display portion that provides the wear state of the center electrode and the ground electrode to a driver.

5. The electrode wear amount predicting system of claim 1, wherein the sensing portion directly measures the current applied to the primary coil.

6. The electrode wear amount predicting system of claim 1, wherein the sensing portion measures the current of the primary coil based on a resistance value of a resistor electrically connected in series to the primary coil and a voltage applied to the resistor.

7. An electrode wear amount predicting method of a spark plug, wherein the spark plug generates spark discharge by a discharge current generated by at least one ignition coil including a primary coil and a secondary coil and includes a center electrode and a ground electrode, the electrode wear amount predicting method comprising:
    determining, by a controller, whether an electrode wear amount predicting condition is satisfied;
    measuring, by a sensing portion, a current applied to the primary coil; and
    determining, by the controller, a wear state of the center electrode and the ground electrode according to an amount of the current applied to the primary coil.

8. The electrode wear amount predicting method of claim 7, wherein the electrode wear amount predicting condition is satisfied when an engine is stopped or the engine is in an idle state.

9. The electrode wear amount predicting method of claim 7, wherein when the current applied to the primary coil is smaller than a set threshold value, the controller is configured to conclude that the center electrode and the ground electrode are worn.

10. The electrode wear amount predicting method of claim 9, further including:
    providing the wear state of the center electrode and the ground electrode to a driver.

11. The electrode wear amount predicting method of claim 10, wherein a display portion is configured to provide the wear state of the center electrode and the ground electrode to the driver.

12. The electrode wear amount predicting method of claim 7, wherein the sensing portion directly measures the current applied to the primary coil.

13. The electrode wear amount predicting method of claim 7, wherein the sensing portion measures the current of the primary coil based on a resistance value of a resistor electrically connected in series to the primary coil and a voltage applied to the resistor.

14. A non-transitory computer readable storage medium on which a program for performing the method of claim 7 is recorded.

* * * * *